United States Patent
Kishikawa

(10) Patent No.: US 9,520,848 B2
(45) Date of Patent: Dec. 13, 2016

(54) AMPLIFIER, LIQUID CRYSTAL DISPLAYING DRIVING CIRCUIT AND LIQUID CRYSTAL DISPLAY APPARATUS

(75) Inventor: Teisuke Kishikawa, Fukuoka (JP)

(73) Assignee: SONY CORPORATION, Tokyo (JP)

( * ) Notice: Subject to any disclaimer, the term of this patent is extended or adjusted under 35 U.S.C. 154(b) by 126 days.

(21) Appl. No.: 13/533,374

(22) Filed: Jun. 26, 2012

(65) Prior Publication Data
US 2013/0016087 A1    Jan. 17, 2013

(30) Foreign Application Priority Data

Jul. 15, 2011 (JP) ................................ 2011-156312

(51) Int. Cl.
 G09G 3/36 (2006.01)
 G06F 3/038 (2013.01)
 H03F 3/45 (2006.01)
 H03F 3/30 (2006.01)

(52) U.S. Cl.
 CPC ........ *H03F 3/45183* (2013.01); *G09G 3/3688* (2013.01); *H03F 3/3022* (2013.01); *G09G 2310/0291* (2013.01); *H03F 2203/45466* (2013.01); *H03F 2203/45471* (2013.01)

(58) Field of Classification Search
 CPC ............... H03F 3/45; G09G 3/36; G06F 3/038
 USPC .................................................. 345/212, 87
 See application file for complete search history.

(56) References Cited

U.S. PATENT DOCUMENTS

| | | | | |
|---|---|---|---|---|
| 5,745,007 A | * | 4/1998 | Redman-White ... | H03F 3/45237 330/253 |
| 6,013,546 A | * | 1/2000 | Gardner et al. ............. | 438/231 |
| 6,147,665 A | * | 11/2000 | Friedman ................. | G09G 3/22 315/169.3 |
| 6,507,350 B1 | * | 1/2003 | Wilson ........................ | 345/690 |
| 6,670,941 B2 | * | 12/2003 | Albu et al. ..................... | 345/98 |
| 7,362,173 B1 | * | 4/2008 | Knausz ................ | H03F 3/4521 330/253 |
| 7,391,264 B2 | * | 6/2008 | Watanabe ..................... | 330/259 |
| 2003/0169092 A1 | * | 9/2003 | Zuk ............................. | 327/391 |
| 2006/0125532 A1 | * | 6/2006 | Chou ........................... | 327/112 |
| 2007/0273441 A1 | * | 11/2007 | Watanabe ..................... | 330/253 |
| 2010/0013558 A1 | * | 1/2010 | Chen et al. .................. | 330/261 |

FOREIGN PATENT DOCUMENTS

JP     2001-156559      6/2001

* cited by examiner

*Primary Examiner* — Amr Awad
*Assistant Examiner* — Wing Chow
(74) *Attorney, Agent, or Firm* — Oblon, McClelland, Maier & Neustadt, L.L.P.

(57) ABSTRACT

Disclosed herein is an amplifier including a voltage follower circuit having differential input terminals and an output terminal fed back to a first one of the differential input terminals, the voltage follower circuit being configured to amplify an input signal inputted to a second one of the differential input terminals and output the amplified signal from the output terminal; a first current source configured to supply a predetermined current to the voltage follower circuit; and a second current source configured to supply current to the voltage follower circuit when a potential difference between the second one of the differential input terminals and the output terminal is equal to or higher than a predetermined value.

4 Claims, 8 Drawing Sheets

F I G . 1
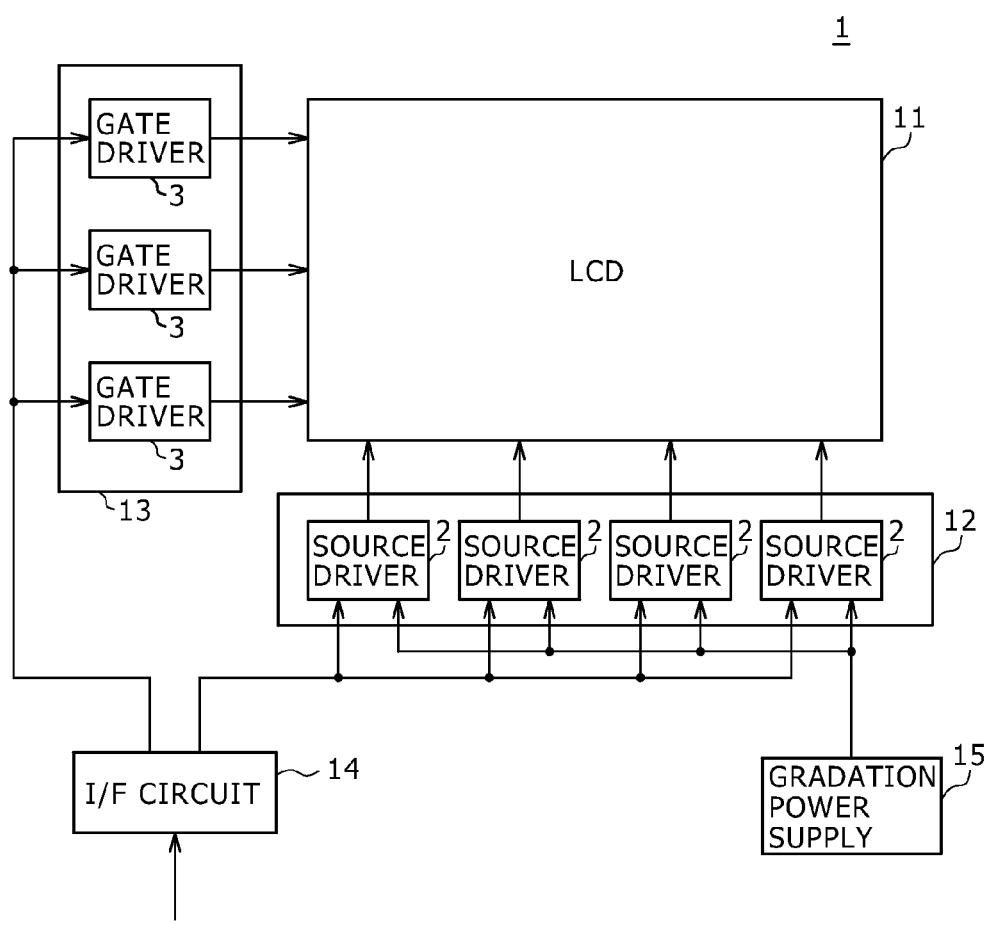

F I G . 3
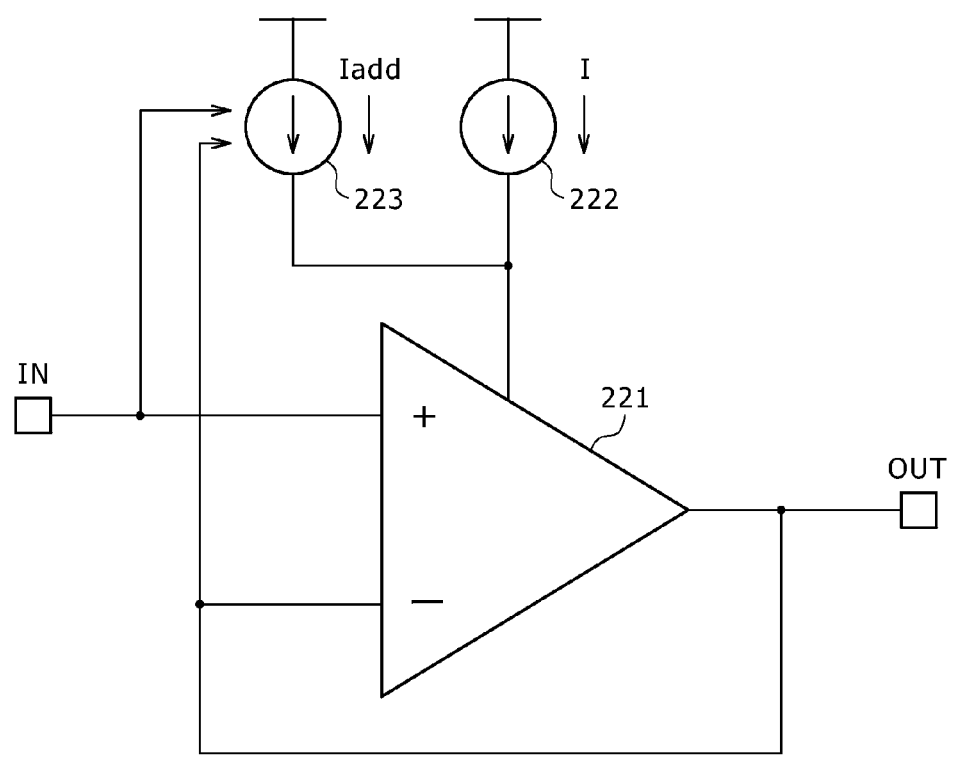

AMPLIFIER, LIQUID CRYSTAL DISPLAYING DRIVING CIRCUIT AND LIQUID CRYSTAL DISPLAY APPARATUS

BACKGROUND

The present disclosure relates to an amplifier, a liquid crystal displaying driving circuit and a liquid crystal display apparatus.

As display apparatus, the liquid crystal display apparatus (LDC: Liquid Crystal Device) is widely spread. In the liquid crystal display section of a liquid crystal display apparatus, a plurality of pixels configured from transistors, diodes and so forth are provided. The pixels are driven by a liquid crystal displaying driving circuit to display an image on the liquid crystal display section. The liquid crystal displaying driving circuit includes a plurality of amplifiers, and a driving signal amplified by each amplifier is supplied to the pixels for each line to drive the pixels.

In recent years, liquid crystal display apparatus are demanded to have a larger screen and higher definition, and also desired to have reduced power consumption. Advancement of screen size increasing and definition enhancement of liquid crystal display apparatus increases the power consumed by amplifiers provided for the lines in the liquid crystal display section. In order to implement low power consumption of liquid crystal display apparatus, it is important to reduce the power consumption of amplifiers in the liquid crystal displaying driving circuit. However, there is a problem that, if the power consumption of the amplifiers of the liquid crystal displaying driving circuit is reduced, then the slew rate of the amplifiers drops.

Japanese Patent Laid-Open No. 2001-156559 discloses, as a method of increasing the slew rate of amplifiers while suppressing their power consumption, a method in which the steady-state current of amplifiers is increased or decreased in response to the increase or decrease in the output potential of the amplifiers. Such an amplifier as disclosed in the document mentioned above includes a steady-state current source and a sub current source for generating current in response to the increase or decrease in the output potential of the amplifier. The steady-state current supplied from the steady-state current source is reduced, and upon rise and fall of an input signal, the sub current source supplies a steady-state current so that the slew rate of the amplifiers can be increased while suppressing the power consumption.

SUMMARY

The semiconductor integrated circuits, into which liquid crystal displaying driving circuits are incorporated, are being adapted to be more miniaturized and to operate at a lower power supply potential. Meanwhile, a power supply potential higher than a fixed value is sometimes required for an operating condition of a circuit. Regarding such case, a method is known in which a high power supply potential (VDDR) is supplied to a circuit which requires a power supply potential higher than a fixed value, but a low power supply potential (VDDL) is supplied to a circuit which can operate with a low power supply potential, thereby suppressing power consumption of the semiconductor integration circuit while allowing operation of the circuit which requires power supply potential higher than the fixed value.

Where circuits whose operation potentials are different from each other are connected, different power supply potentials are sometimes employed for the input stage and output stage in accordance with the operation potentials of the circuits at the following stage and the preceding stage.

The amplifier disclosed in the document mentioned hereinabove is supplied with one power supply potential, and it is not assumed to supply different power supply potentials to the input stage and the output stage as above.

Therefore, it is desirable to provide an amplifier adapted to increase the slew rate while suppressing power consumption irrespective of the power supply potentials at the input stage and output stage.

Also it is desirable to provide a liquid crystal display driving apparatus and a liquid crystal display apparatus including such an amplifier as described above.

According to an embodiment of the present disclosure, there is provided an amplifier, including a voltage follower circuit having differential input terminals and an output terminal fed back to a first one of the differential input terminals, the voltage follower circuit being configured to amplify an input signal inputted to a second one of the differential input terminals and output the amplified signal from the output terminal; a first current source configured to supply a predetermined current to the voltage follower circuit; and a second current source configured to supply current to the voltage follower circuit when a potential difference between the second one of the differential input terminals and the output terminal is equal to or higher than a predetermined value.

Further, according to another embodiment of the present disclosure, there is provided a liquid crystal displaying driving circuit including the amplifier described above and a D/A conversion circuit.

Furthermore, according to another embodiment of the present disclosure, there is provided a liquid crystal display apparatus including a driving circuit that includes the amplifier described above, a decoder circuit, and a D/A conversion circuit; and a liquid crystal display section.

In the amplifier, liquid crystal displaying driving circuit and liquid crystal display apparatus according to the embodiments of the present disclosure, the slew rate can be increased while the power consumption of the amplifier is suppressed irrespective of the power supply potentials at the input stage and output stage.

The above features and advantages of the present technology will become apparent from the following description and the appended claims, taken in conjunction with the accompanying drawings in which like parts or elements denoted by like reference characters.

BRIEF DESCRIPTION OF THE DRAWINGS

FIG. 1 is a block diagram showing a liquid crystal display apparatus according to an embodiment of the present technology;

FIG. 3 is a circuit diagram showing an amplifier of the source driver circuit;

DETAILED DESCRIPTION OF THE PREFERRED EMBODIMENT

Figure 2:
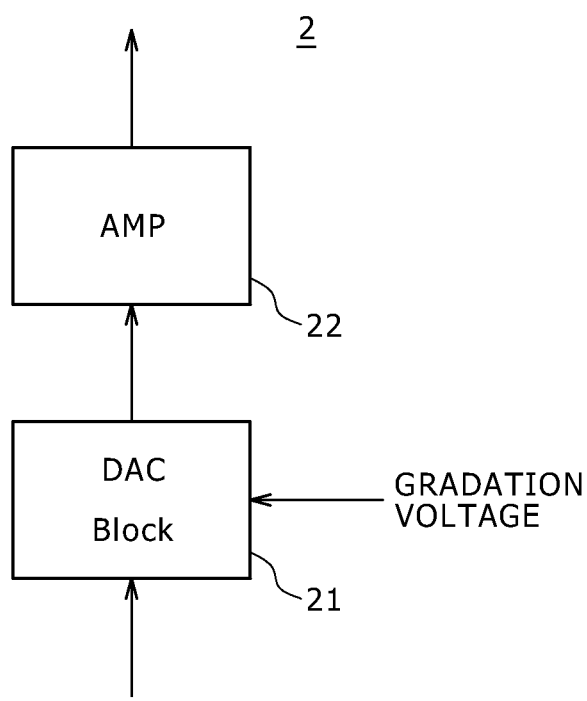
FIG. 2 is a block diagram showing a source driver circuit of the liquid crystal display apparatus.

Referring first to FIG. 1, a liquid crystal display apparatus 1 according to an embodiment of the present technology is described. The liquid crystal display apparatus 1 includes a liquid crystal display section 11, a horizontal driving circuit 12 including a plurality of source driver circuits 2, a vertical driving circuit 13 including a plurality of gate driver circuits 3, an interface circuit 14 and a gradation power supply 15.

The liquid crystal display section 11 includes, although not shown, a semiconductor substrate on which transparent pixel electrodes and TFTs (Thin Film Transistors) are disposed, and an opposing substrate on which one transparent electrode is formed over the overall displaying section. Liquid crystals are sealed between the substrates. The TFTs individually have a switching function controlled by the horizontal driving circuit 12 and the vertical driving circuit 13 to apply a driving signal to the pixel electrodes, whereby a potential difference appears between the pixel electrodes and the electrode on the opposing substrate. Consequently, the transmittance of the liquid crystals change and an image is displayed.

Though not shown, the liquid crystal display section 11 includes a plurality of scanning lines arrayed in the row direction and a plurality of data lines arrayed in the column direction. The pixel electrodes and the TFTs of the liquid crystal display section 11 are disposed in a matrix at positions at which the scanning lines and the data lines cross with each other.

The horizontal driving circuit 12 includes the plurality of source driver circuits 2 individually provided for the data lines. The source driver circuits 2 supply driving signals generated therein to the respective data lines. Details of the horizontal driving circuit 12 are hereinafter described.

The vertical driving circuit 13 includes the plurality of gate driver circuits 3 individually provided for the scanning lines. The gate driver circuits 3 supply driving signals generated therein to the respective scanning lines.

As such, the source driver circuits 2 and the gate driver circuits 3 supply the driving signals to the data lines and the scanning lines, respectively, so as to drive the pixel electrodes of the liquid crystal display section 11.

The interface circuit 14 outputs a video signal and control signals supplied thereto from the outside to the horizontal driving circuit 12 and the vertical driving circuit 13. The control signals include, for example, a vertical start signal, a vertical clock, an enable signal, a horizontal start signal and a horizontal clock. The video signal includes, for example, serial image data R, G and B. The interface circuit 14 converts the serial image data R, G and B into parallel image data R, G and B and outputs the parallel image data as an input video signal to the source driver circuits 2 of the horizontal driving circuit 12. In other words, the interface circuit 14 operates as a decoder circuit for generating an input video signal of parallel image data R, G and B based on a video signal inputted from the outside.

The gradation power supply 15 generates a gradation voltage. The gradation power supply 15 outputs the generated gradation voltage to the source driver circuit 2.

Next, the source driver circuit 2 is described with reference to FIG. 2. The source driver circuit 2 includes a D/A conversion circuit (DAC Block) 21 and an amplifier 22.

The D/A conversion circuit 21 receives an input video signal from the interface circuit 14 operating as a decoder circuit and a gradation voltage from the gradation power supply 15. The D/A conversion circuit 21 selects the gradation voltage in response to the input video signal, and outputs the selected gradation voltage as a driving analog signal to the amplifier 22.

The driving analog signal from the D/A conversion circuit 21 is inputted to the amplifier 22. The amplifier 22 amplifies the driving analog signal to generate a driving signal. The amplifier 22 supplies the generated driving signal to a data line.

The amplifier 22 is described with reference to FIG. 3. The amplifier 22 includes a voltage follower circuit 221, a first current source 222 and a second current source 223.

The voltage follower circuit 221 has differential input terminals and an output terminal which is fed back to one of the differential input terminals. The voltage follower circuit 221 amplifies an input signal inputted to the other differential input terminal (hereinafter referred to as input terminal IN) and outputs the amplified input signal from the output terminal OUT.

The first current source 222 is a constant current source which supplies current I necessary for the voltage follower circuit 221 to operate. The first current source 222 supplies the predetermined current I to the voltage follower circuit 221.

The second current source 223 supplies current Iadd to the voltage follower circuit 221 when the potential difference between the input terminal IN and the output terminal OUT is equal to or greater than a predetermined value.

Details of the amplifier 22 are described with reference to FIG. 4.

The voltage follower circuit 221 includes PMOS transistors M10 and M11. The PMOS transistor M11 is connected at the gate terminal thereof to the input terminal IN and at the source terminal thereof to the first current source 222 and the second current source 223. The PMOS transistor M10 is connected at the gate terminal thereof to the output terminal OUT and at the source terminal thereof to the first current source 222 and the second current source 223. The gate terminals of the PMOS transistors M10 and M11 constitute the differential input terminals of the voltage follower circuit 221.

The voltage follower circuit 221 includes NMOS transistors M12 and M13. The NMOS transistor M12 is connected at the drain terminal thereof to the drain terminal of the PMOS transistor M10 and at the source terminal thereof to a second power supply potential Vss. The NMOS transistor M13 is connected at the drain terminal thereof to the drain terminal of the PMOS transistor M11 and at the source terminal thereof to the second power supply potential Vss. The NMOS transistor M12 is connected at the gate terminal thereof to the gate terminal of the NMOS transistor M13 and the drain terminal of the NMOS transistor M12, and the NMOS transistors M12 and M13 constitute a current mirror circuit. The circuit configured from the transistors M10 to M13 is hereinafter referred to as the differential stage.

The voltage follower circuit 221 includes a PMOS transistor M14 connected at the source terminal thereof to a low power supply potential VDDL. A bias voltage Vb2 is applied to the gate terminal of the PMOS transistor M14. The voltage follower circuit 221 includes an NMOS transistor M15 connected at the drain terminal thereof to the drain terminal of the PMOS transistor M14, and a PMOS transistor M16 connected at the source terminal thereof to the drain terminal of the PMOS transistor M14. A bias voltage Vb3 is applied to the gate terminal of the NMOS transistor M15, and a bias voltage Vb4 is applied to the gate terminal of the PMOS transistor M16. The voltage follower circuit 221 includes an NMOS transistor M17 connected at the drain terminal thereof to the source terminal of the gradation power supply 15 and the drain terminal of the PMOS transistor M16 and at the source terminal thereof to the second power supply potential Vss. A bias voltage Vb5 is applied to the gate terminal of the NMOS transistor M17.

The voltage follower circuit 221 includes a PMOS transistor M18 connected at the source terminal thereof to the low power supply potential VDDL and at the drain terminal thereof to the output terminal OUT. The gate terminal of the PMOS transistor M18 is connected to the drain terminal of the PMOS transistor M14. The gate terminal of the PMOS transistor M18 is applied with a voltage which depends on the sizes of the transistors M14 to M17 and the bias voltages Vb2 to Vb5.

The voltage follower circuit 221 includes an NMOS transistor M19 connected at the drain terminal thereof to the output terminal OUT and at the source terminal thereof to the second power supply potential Vss. The gate terminal of the NMOS transistor M19 is connected to the drain terminal of the PMOS transistor M11.

The voltage follower circuit 221 includes a capacitive element C1 connected at one terminal thereof to the gate terminal of the PMOS transistor M18 and at the other terminal thereof to the drain terminal of the PMOS transistor M18, and another capacitive element C2 connected at one terminal thereof to the gate terminal of the NMOS transistor M19 and at the other terminal thereof to the drain terminal of the NMOS transistor M19. Further, the voltage follower circuit 221 includes a capacitive element C3 connected at one terminal thereof to the output terminal OUT and at the other terminal thereof to the second power supply potential Vss.

It is to be noted that the voltage follower circuit 221 described above is one example, and a voltage follower circuit of a configuration different from that described hereinabove with reference to FIG. 4 may be used as the amplification stage of the amplifier 22.

Figure 4:
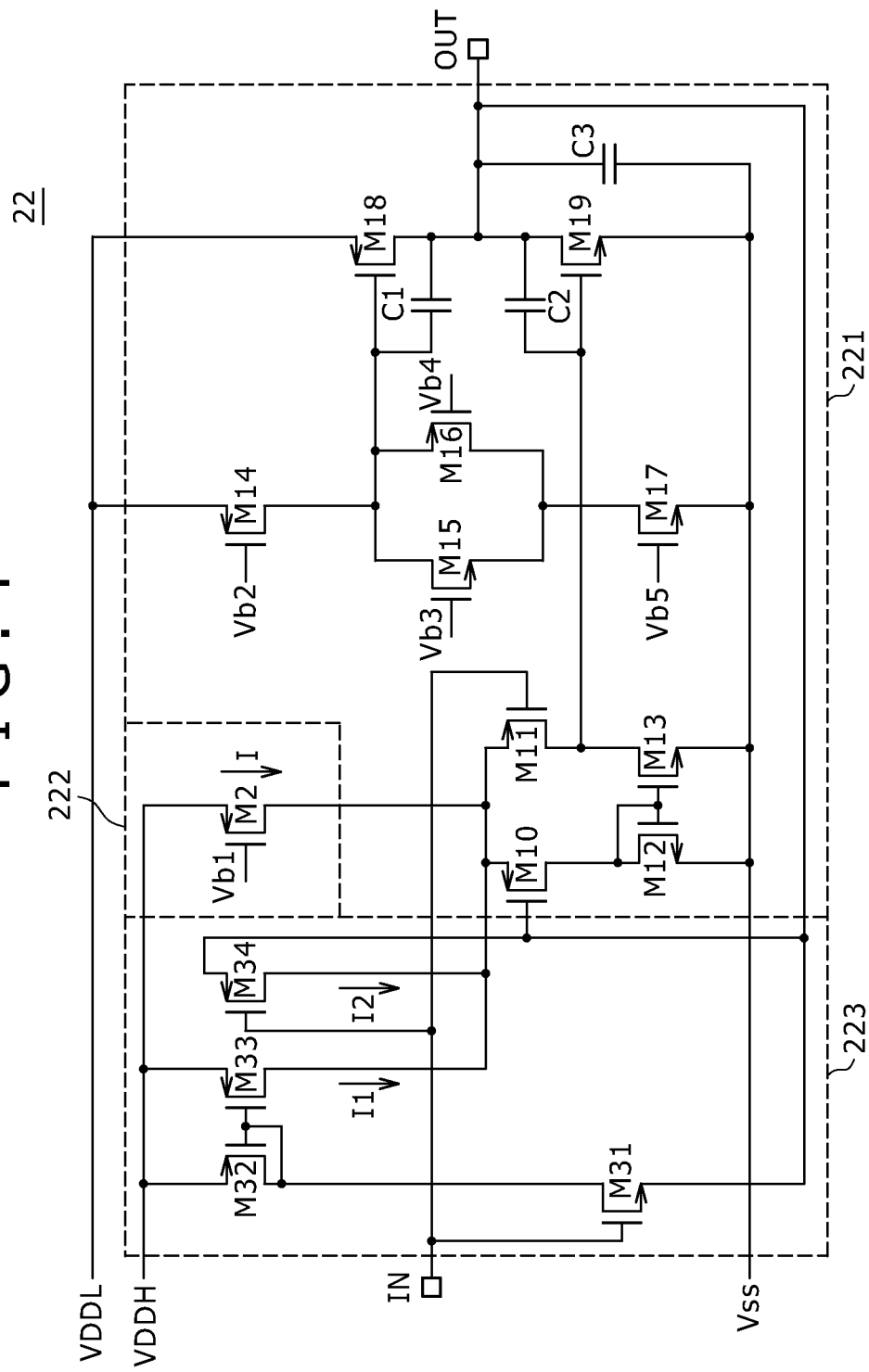
FIG. 4 is a circuit diagram showing a detailed configuration of the amplifier.

The slew rate of the voltage follower circuit 221 of FIG. 4 depends upon the current flowing through the capacitive elements C1 and C2 and the differential stage. In particular, if the current flowing through the differential stage is Id (Id=I+Iadd), then the slew rate of the voltage follower circuit 221 is determined by the quotient between the current Id and the capacitive element C1 or the quotient between the current Id and the capacitive element C2.

The first current source 222 includes a PMOS transistor M2 connected at the source terminal thereof to a high power supply potential and connected at the drain terminal thereof to the differential stage of the voltage follower circuit 221. A bias voltage Vb1 is applied to the gate terminal of the PMOS transistor M2. The PMOS transistor M2 supplies current I to the voltage follower circuit 221 in response to the bias voltage Vb1.

The second current source 223 includes an NMOS transistor M31 connected at the source terminal thereof to the output terminal OUT and at the gate terminal thereof to the input terminal IN. The NMOS transistor M31 generates current in response to the potential difference between the source and the gate thereof, that is, the potential difference between the output potential and the input potential.

The second current source 223 includes a PMOS transistor M32 connected at the source terminal thereof to the high power supply potential VDDH and at the drain terminal thereof to the drain terminal of the NMOS transistor M31, and a PMOS transistor M33 connected at the source terminal thereof to the high power supply potential VDDH and at the drain terminal thereof to the differential stage of the voltage follower circuit 221. The PMOS transistor M32 is connected at the gate terminal thereof to the gate terminal of the PMOS transistor M33 and the drain terminal of the PMOS transistor M32. The PMOS transistors M32 and M33 constitute a current mirror circuit. The PMOS transistors M32 and M33 supply current I1 generated by the NMOS transistor M31 to the PMOS transistors M10 and M11 of the voltage follower circuit 221.

The second current source 223 also includes a PMOS transistor M34 connected at the source terminal thereof to the output terminal OUT and at the drain terminal thereof to the differential stage of the voltage follower circuit 221. The gate terminal of the PMOS transistor M34 is connected to the input terminal IN, and the PMOS transistor M34 generates current I2 in response to the potential difference between the source and the gate thereof, that is, in response to the potential difference between the output potential and the input potential. The PMOS transistor M34 supplies the current I2 generated therein to the PMOS transistors M10 and M11 of the voltage follower circuit 221.

Figure 5:
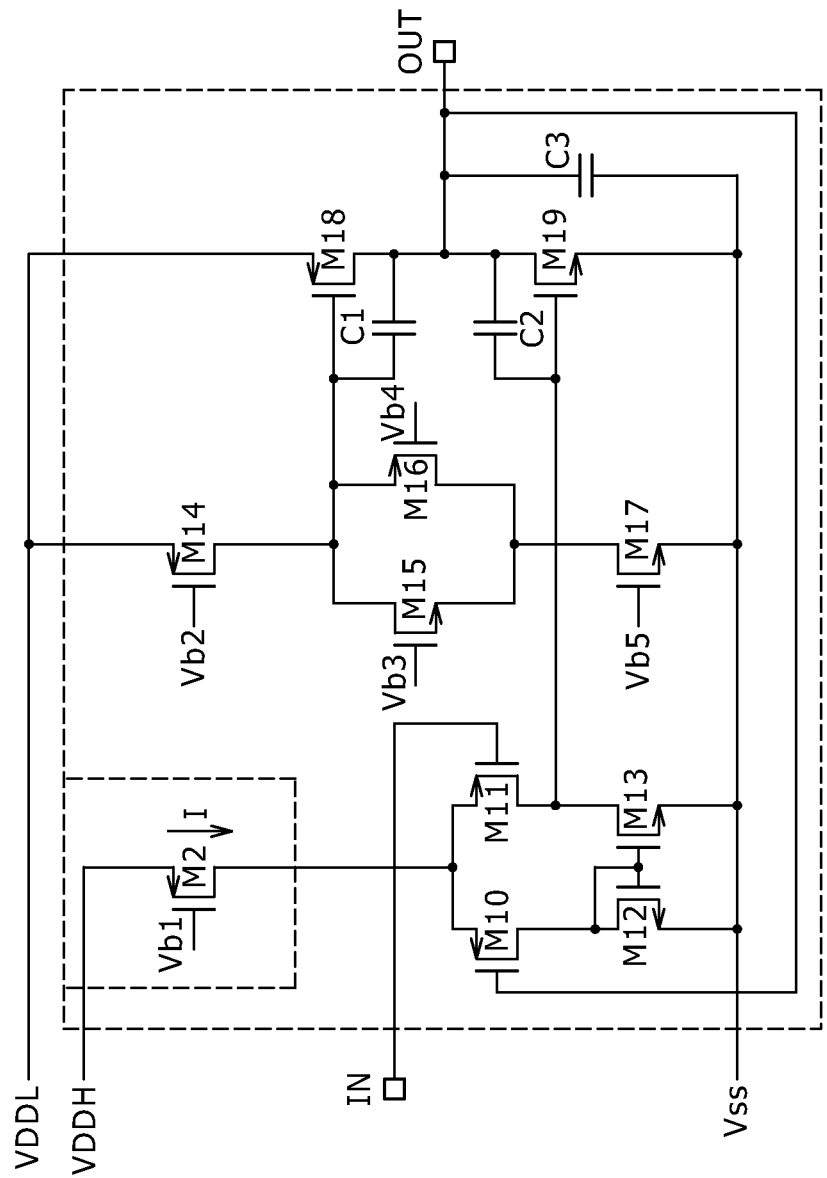
FIG. 5 is a circuit diagram showing a configuration of an amplifier as a comparative example with the amplifier of FIG. 4.

Next, effects of the amplifier 22 are described. First, for comparison, an amplifier 22a which does not include the second current source 223 is described. FIG. 5 shows a circuit configuration of the amplifier 22a. Referring to FIG. 5, the amplifier 22a has a configuration same as that of the amplifier 22 of FIG. 4 except that it does not include the second current source 223. Therefore, the amplifier 22a is described below using reference characters same as those used for the amplifier 22.

The input terminal IN of the voltage follower circuit 221 of the amplifier 22a operates also as the input terminal IN of the amplifier 22a. The input terminal IN receives a driving analog signal from the D/A conversion circuit 21. The voltage follower circuit 221 amplifies the driving analog signal inputted thereto by means of the differential stage to produce a driving signal. The driving signal is supplied to a gate line of the liquid crystal display section 11 of FIG. 1 through the output terminal OUT. The current necessary for the differential stage of the voltage follower circuit 221 to generate a driving signal is supplied from the first current source 222.

Since the number of provided source driver circuits 2 is equal to the number of gate lines, the number of amplifiers 22a incorporated in the source driver circuits 2 is as many as the number of the gate lines. Accordingly, if the outputs of all of the amplifiers 22a are to rise, that is, if the output potential at the output terminal OUT is to rise in all of the voltage follower circuits 221, in accordance with the increase in the input potential at the input terminal IN, the potentials at the source terminals of the PMOS transistors M10 and M11 shown in FIG. 5 also rise by a similar degree. As the potentials at the source terminals of the PMOS transistors M10 and M11 rise, the potential at the drain terminal of the PMOS transistor M2 in the first current source 222 rises. This rise in the potential at the drain terminal of the PMOS transistor M2 raises the potential at the gate terminal of the PMOS transistor M2 due to the influence of the parasitic capacitance between the gate and the drain of the PMOS transistor M2. The rise in the potential at the gate terminal of the PMOS transistor M2 causes the current I generated by the PMOS transistor M2 to decrease.

As described above, the slew rate of the voltage follower circuit 221 depends upon the current I flowing through the capacitive elements C1, C2 and the differential stage. Accordingly, as the current I generated by the PMOS transistor M2 decreases, the slew rate of the voltage follower circuit 221 deteriorates.

Generally, the bias voltage Vb1 applied to the gate terminal of the PMOS transistor M2 of the first current source 222 is generated by a single bias voltage generation section (not shown) and supplied to every amplifier 22a in order to prevent increase of the chip area. If the output potential rises in all amplifiers 22a, in accordance with the rise of the input potential at the input terminal IN, the potential at the gate terminal of every PMOS transistor M2 rises. However, the bias voltage generation section not shown may be unable to meet the rise of the potential at the gate terminals. Therefore, in a case where the output potential rises in all amplifiers 22a, the slew rate of the amplifiers 22a deteriorates significantly in comparison with that in a case in which the output potential of one amplifier 22a rises.

Figure 6:
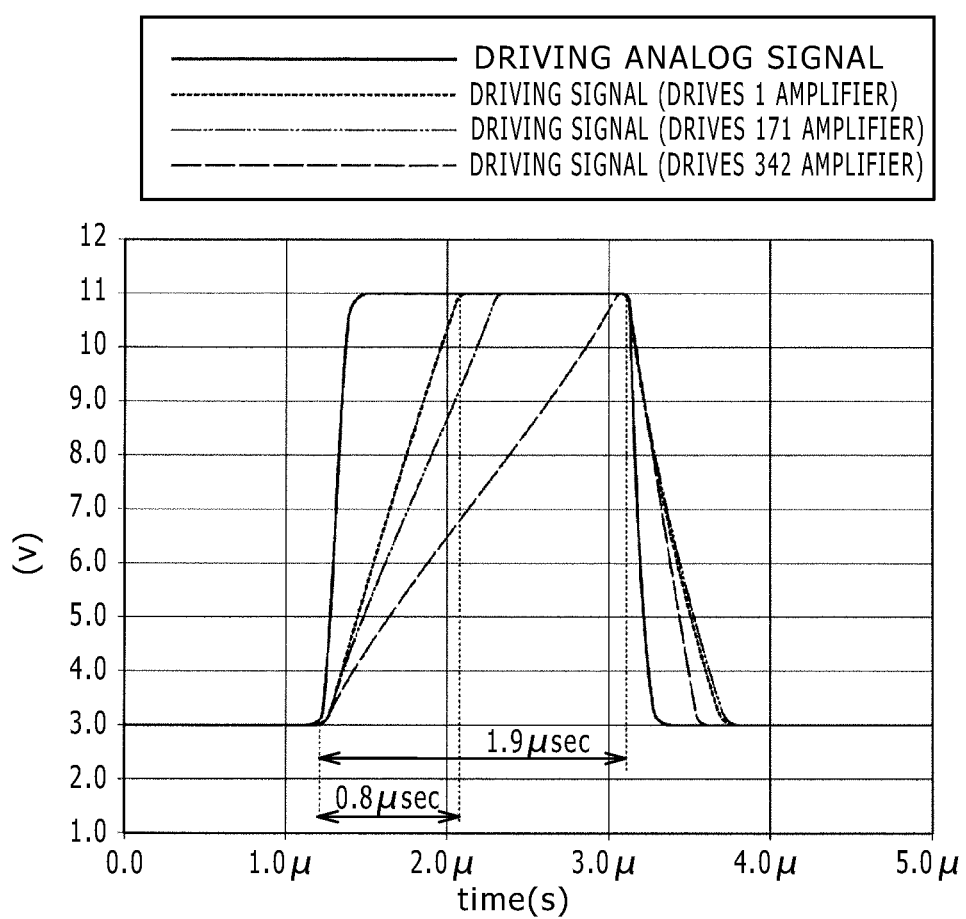
FIG. 6 is a diagrammatic view illustrating results of a simulation carried out with the amplifier of FIG. 5.

FIG. 6 illustrates the slew rate of the amplifier 22a shown in FIG. 5. In particular, FIG. 6 illustrates the results of a simulation of the amplifier 22a in a case where the number of gate lines which the liquid crystal display apparatus 1 has, that is, the number of amplifiers 22a is 342. The solid line curve in FIG. 6 illustrates the driving analog signal inputted to the input terminal IN. The dotted line curve in FIG. 6 illustrates a driving signal outputted from the output terminal OUT of one amplifier 22a when only the one amplifier 22a was driven. The alternate long and two short dashes line curve in FIG. 6 illustrates a driving signal outputted from the output terminal OUT of one of the driven amplifiers 22a when 171 amplifiers 22a were driven. The broken line curve in FIG. 6 illustrates a driving signal outputted from the output terminal OUT of one of the driven amplifiers 22a when all 342 amplifiers 22a were driven.

As can be seen from FIG. 6, when one amplifier 22a was driven, the rise time of the outputted driving signal was 0.8 μsec, but when all amplifiers 22a were driven, the rise time of the outputted riving signal was 1.9 μsec. Thus, as the number of amplifiers 22a to be driven increases, the rise time of the outputted driving signal slows down, and the slew rate of the amplifiers 22a deteriorates.

In consideration to this, the amplifier 22 according to the present embodiment is configured such that it includes the second current source 223 in addition to the first current source 222. In the following, an effect by the second current source 223 is described with reference to FIG. 4.

As shown in FIG. 4, the second current source 223 includes the NMOS transistor M31. The gate terminal of the NMOS transistor M31 is connected to the input terminal IN, and its source terminal is connected to the output terminal OUT. Accordingly, the NMOS transistor M31 generates current I1 when the potential at the input terminal IN is higher than the potential at the output terminal OUT by a predetermined value or more. This predetermined value depends upon the threshold voltage of the NMOS transistor M31. The current I1 generated by the NMOS transistor M31 is supplied to the voltage follower circuit 221 through the current mirror circuit constituted by the PMOS transistors M32 and M33.

The second current source 223 also includes the PMOS transistor M34. The gate terminal of the PMOS transistor M34 is connected to the input terminal IN, and the source terminal thereof is connected to the output terminal OUT. Accordingly, the PMOS transistor M34 generates current I2 when the potential at the input terminal IN is lower than the potential at the output terminal OUT by a predetermined value or more. This predetermined value depends upon the threshold voltage of the PMOS transistor M34. The current I2 generated by the PMOS transistor M34 is supplied to the voltage follower circuit 221.

In this manner, the amplifier 22 according to the present embodiment detects the variation of the potential difference between the output terminal OUT and the input terminal IN and supplies additional current Iadd (=I1+I2) from the second current source 223 to the voltage follower circuit 221 in response to the variation of the potential difference. By supplying the additional current in response to the potential difference between the input terminal IN and the output terminal OUT, even when the amplifier 22 has a plurality of power potentials, the slew rate can be improved with the power consumption of the amplifier 22 being suppressed.

Figure 7:
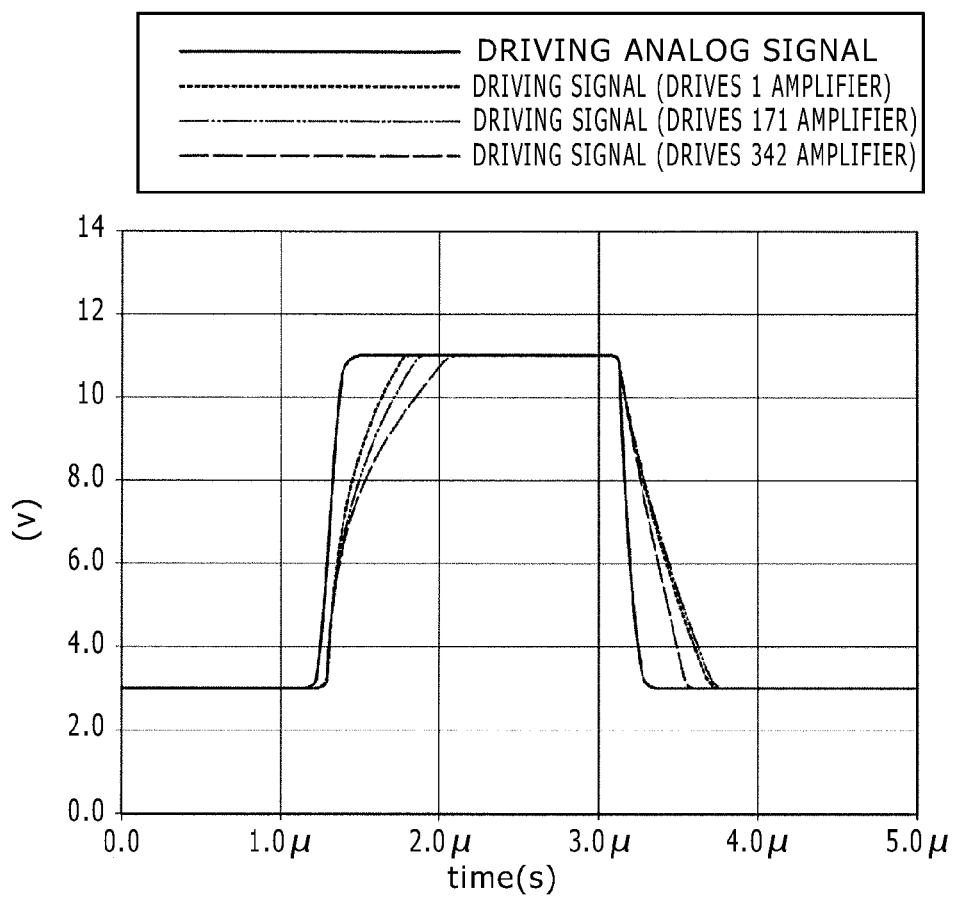
FIGS. 7 to 9 are diagrammatic views illustrating results of a simulation carried out with the amplifier of FIG. 4.

FIG. 7 illustrates the slew rate of the amplifier 22 shown in FIG. 4. In particular, FIG. 7 illustrates the results of a simulation of the amplifier 22 in a case where the number of gate lines which the liquid crystal display apparatus 1 has, that is, the number of amplifiers 22 is 342. The solid line curve in FIG. 7 illustrates the driving analog signal inputted to the input terminal IN. The dotted line curve in FIG. 7 illustrates a driving signal outputted from the output terminal OUT of one amplifier 22 when only the one amplifier 22 was driven. The alternate long and two short dashes line curve in FIG. 7 illustrates a driving signal outputted from the output terminal OUT of one of the driven amplifiers 22 when 171 amplifiers 22 were driven. The broken line curve in FIG. 7 illustrates a driving signal outputted from the output terminal OUT of one of the driven amplifiers 22 when all 342 amplifiers 22 were driven.

As can be seen from FIG. 7, as the number of driven amplifiers 22 increases, the rise of the outputted driving signal is slowed down a little, but the amount of delay is reduced in comparison with that in FIG. 6. Thus, by using the amplifier 22 according to the present embodiment in this manner, even when the number of driven amplifiers 22 increases, deterioration of the slew rate can be suppressed.

Figure 8:
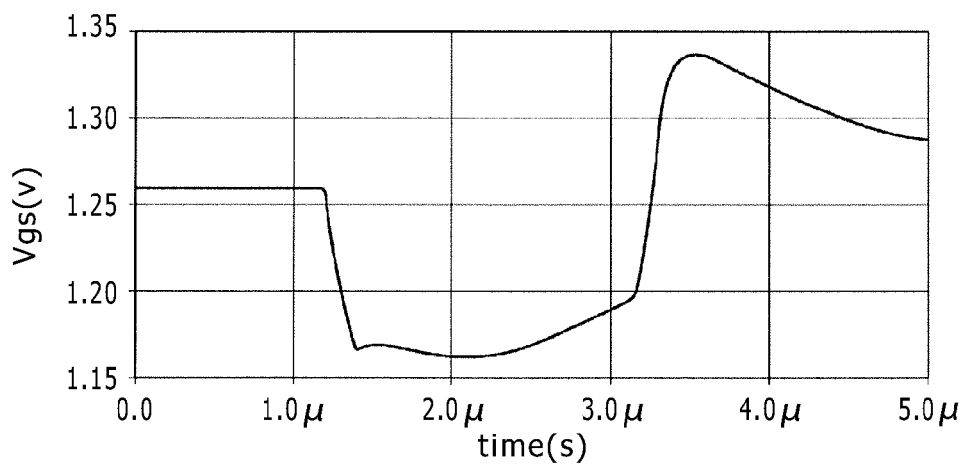

FIG. 8 illustrates the variation of the voltage Vgs between the gate and the source of the PMOS transistor M2 in the first current source 222 when the driving analog signal illustrated in FIG. 7 is inputted to the input terminal IN of the amplifier 22. As can be seen from FIG. 8, the voltage Vgs between the gate and the source of the PMOS transistor M2 significantly falls upon rising of the driving analog signal and significantly rises upon falling of the driving analog signal. In this manner, when the driving analog signal is inputted to the input terminal IN, the voltage Vgs between the gate and the source of the PMOS transistor M2, that is, the operation of the first current source varies. However, according to the present embodiment, deterioration of the slew rate of the amplifier 22 can be suppressed as shown in FIG. 7 by the provision of the second current source 223.

Figure 9:
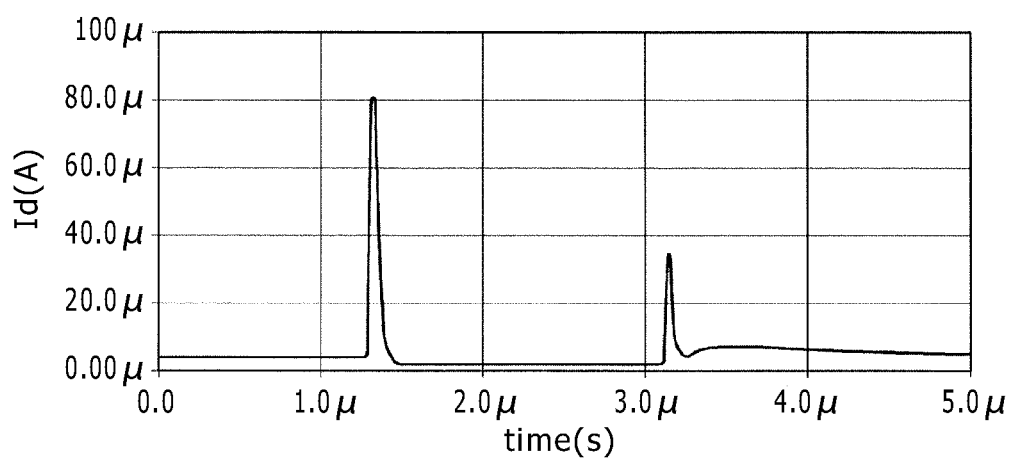

FIG. 9 illustrates the current Id (I+Iadd) supplied to the differential stage when the driving analog signal illustrated in FIG. 7 is inputted to the input terminal IN of the amplifier 22. From FIG. 9, it can be recognized that large current flows upon the rising and falling of the driving analog signal. Since the second current source 223 supplies the current Iadd in response to the difference between the potential at the input terminal IN and the potential at the output terminal OUT as shown in FIG. 9, deterioration of the slew rate of the amplifier 22 can be suppressed as shown in FIG. 7.

As described above, the amplifier 22 according to the present embodiment includes the second current source 223, and therefore it can supply additional current Iadd to the voltage follower circuit 221 in response to the variation of the potential difference between the input terminal IN and the output terminal OUT. Consequently, deterioration of the slew rate of the amplifier 22 can be suppressed with the power consumption of the first current source 222 being reduced.

It is to be noted that, while the present embodiment described above was directed to a case in which the amplifier 22 is applied to a liquid crystal display apparatus 1, the amplifier 22 can be applied not only to the liquid crystal display apparatus 1 but also to any circuit so long as the circuit amplifies a signal using a voltage follower circuit 221. Since the influence of deterioration on the slew rate is large when a plurality of amplifiers 22 are driven, it is preferable to apply the amplifier 22 of the present embodiment to a circuit in which many amplifiers 22 are driven such as the liquid crystal display apparatus 1.

Finally, the embodiment described above is a mere example of the present technology, and the present technology is not limited to the embodiment described above. It is apparent that those skilled in the art could make various alterations and modifications without departing from the spirit and scope of the present technology as defined in the claims.

The present disclosure contains subject matter related to that disclosed in the Japanese Priority Patent Application JP 2011-156312 filed in the Japan Patent Office on Jul. 15, 2011, the entire content of which is hereby incorporated by reference.

What is claimed is:

1. An amplifier, comprising:
 a voltage follower circuit that includes a first input terminal, a second input terminal, and an output terminal which is connected to said second input terminal;
 a first current source configured to supply a first current to said voltage follower circuit;
 a second current source configured to supply a second current to said voltage follower circuit,
  wherein said second current source comprises a first PMOS transistor and a second PMOS transistor,
  wherein a drain terminal of said first PMOS transistor and a drain terminal of said second PMOS transistor are directly connected to said voltage follower circuit,
  wherein a gate terminal of said first PMOS transistor is directly connected to said first input terminal;
 an input voltage supplied to said first input terminal and said second current source; and
 an output voltage, output from said output terminal,
  wherein said second current source is configured to supply said second current in an event a difference between said input voltage and said output voltage is larger than a first predetermined voltage.

2. The amplifier according to claim 1,
 wherein said second current source is configured to supply a third current to said voltage follower circuit in an event the difference between said output voltage and said input voltage is less than a second predetermined voltage.

3. A liquid crystal displaying driving circuit for outputting a driving signal for driving pixels provided in a liquid crystal displaying section operative to display an image, said liquid crystal displaying driving circuit comprising:
 a digital-to-analog conversion circuit configured to generate a driving analog signal in response to an input video signal; and
 an amplifier including:

a voltage follower circuit that includes a first input terminal, a second input terminal, and an output terminal which is connected to said second input terminal, wherein said voltage follower circuit is configured to:
  amplify said driving analog signal input to said first input terminal, and
  output said amplified driving analog signal from said output terminal,
 a first current source configured to supply a first current to said voltage follower circuit, and
 a second current source configured to supply a second current to said voltage follower circuit,
  wherein said second current source comprises a first PMOS transistor and a second PMOS transistor,
  wherein a drain terminal of said first PMOS transistor and a drain terminal of said second PMOS transistor are directly connected to said voltage follower circuit,
  wherein a gate terminal of said first PMOS transistor is directly connected to said first input terminal,
 wherein said driving analog signal is input to said second current source, and
 wherein said second current source is configured to supply said second current in an event a difference between an input voltage corresponding to said driving analog signal and an output voltage corresponding to said amplified driving analog signal is larger than a predetermined voltage.

4. A liquid crystal display apparatus, comprising:
 a driving circuit including:
  a decoder circuit configured to decode an input signal to produce an input video signal,
  a digital-to-analog conversion circuit configured to generate a driving analog signal in response to said input video signal,
  an amplification circuit including a plurality of amplifiers each including:
   a voltage follower circuit that includes a first input terminal, a second input terminal, and an output terminal which is connected to said second input terminal, wherein said voltage follower circuit is configured to:
    amplify said driving analog signal input to said first input terminal, and
    output said amplified driving analog signal from said output terminal,
   a first current source configured to supply a first current to said voltage follower circuit, and
   a second current source configured to supply a second current to said voltage follower circuit,
    wherein said second current source comprises a first PMOS transistor and a second PMOS transistor,
    wherein a drain terminal of said first PMOS transistor and a drain terminal of said second PMOS transistor are directly connected to said voltage follower circuit,
    wherein a gate terminal of said first PMOS transistor is directly connected to said first input terminal,
  wherein said driving analog signal is input to said second current source, and
  wherein said second current source is configured to supply said second current in an event a difference between an input voltage corresponding to said driving analog signal and an output voltage corresponding to said amplified driving analog signal is larger than a predetermined voltage; and a liquid crystal displaying section including a plurality of pixels driven by said driving analog signal and configured to display an image.

* * * * *